(12) United States Patent
Kim et al.

(10) Patent No.: US 6,717,478 B1
(45) Date of Patent: Apr. 6, 2004

(54) MULTI-PHASE VOLTAGE CONTROLLED OSCILLATOR (VCO) WITH COMMON MODE CONTROL

(75) Inventors: Ook Kim, Palo Alto, CA (US); Hung Sung Li, Sunnyvale, CA (US); Inyeol Lee, Cupertino, CA (US); Gyudong Kim, San Jose, CA (US); Yongman Lee, Pleasanton, CA (US)

(73) Assignee: Silicon Image, Sunnyvale, CA (US)

( * ) Notice: Subject to any disclaimer, the term of this patent is extended or adjusted under 35 U.S.C. 154(b) by 0 days.

(21) Appl. No.: 09/989,587

(22) Filed: Nov. 20, 2001

Related U.S. Application Data

(60) Provisional application No. 60/282,672, filed on Apr. 9, 2001.

(51) Int. Cl.[7] .............................................. H03B 27/00

(52) U.S. Cl. ........................................... 331/57; 331/46

(58) Field of Search ............................ 331/57, 46, 34, 331/15

(56) References Cited

U.S. PATENT DOCUMENTS

| | | | | |
|---|---|---|---|---|
| 6,323,738 B1 | * | 11/2001 | Yoshizawa et al. | ............ 331/57 |
| 6,414,557 B1 | * | 7/2002 | Liu | ............................ 331/57 |
| 6,456,166 B2 | * | 9/2002 | Yabe | .......................... 331/34 |
| 6,456,167 B1 | * | 9/2002 | Huang | ......................... 331/46 |
| 2002/0000885 A1 | * | 1/2002 | Horikawa et al. | ............ 331/15 |

* cited by examiner

Primary Examiner—Robert Pascal
Assistant Examiner—Joseph Chang
(74) Attorney, Agent, or Firm—Perkins Coie LLP

(57) ABSTRACT

A voltage controlled oscillator ("VCO") circuit capable of generating signals with reduced jitter and/or low-phase noise is provided. One embodiment provides a plurality of cascaded VCO cells, where each VCO cell can include a source coupled differential pair, a bias transistor connected to the differential pair for biasing the differential pair, a resistive load pair connected to the differential pair, and a voltage controlled capacitor pair or varactor pair connected to the differential pair. The varactors provide control over the frequency of the oscillations produced by the VCO circuit in combination with a control voltage. A phase frequency detector combined with a charge pump and loop filter provide the control voltage.

37 Claims, 5 Drawing Sheets

MULTI-PHASE VOLTAGE CONTROLLED OSCILLATOR (VCO) WITH COMMON MODE CONTROL

CROSS-REFERENCE TO RELATED APPLICATION

This patent application claims the benefit of U.S. Provisional patent application No. 60/282,672, filed Apr. 9, 2001, incorporated herein by reference.

BACKGROUND

1. Technical Field

Embodiments of the invention relate to systems and methods for providing a multi-phase voltage-controlled oscillator ("VCO").

2. Description of the Background

As the bandwidth of digital data communication increases, the performance of a given communication device's clock signal generator (i.e., frequency synthesizer) becomes more important. Stated differently, highly stable clock signals, generated by a monolithic integrated circuit, facilitate higher-quality, high-bandwidth communication. For example, radio frequency ("RF") transceivers and data samplers in high-speed serial link receivers are applications that rely on stable clock signals.

One aspect of the stabilizer of a frequency synthesizer is the exactness of the time interval, or of the phase difference, between the various clock signals produced by the synthesizer. Thus, measuring a frequency synthesizer's jitter in the time domain, or phase noise in the frequency domain, is one indication of the stability of a frequency synthesizer. In other words, low jitter performance, or equivalently low phase noise performance, is an important basis for selecting a frequency synthesizer. A typical frequency synthesizer includes a VCO and other phase correcting feedback circuitry. The jitter performance of the VCO is reflected in the performance of the frequency synthesizer. Various sources of interference give rise to disturbance of the phases of the signals produced by a VCO. The sources of interference can include varying output voltage swings and varying power supply parameters.

A VCO can include cascaded VCO cells. Each VCO cell can include a transconductor, a capacitor and a load. Transconductance is symbolized by $g_m$ and is often measured in microsiemens ($10^{-6}$ siemens). By way of example, a transconductance amplifier is an amplifier that supplies an output current proportional to its input voltage. The transconductance amplifier appears to be a current source with a high output impedance which drives a relatively much lower load impedance. Controlling the transconductance, or the load resistance, provides control over the frequency generated by the VCO cell. One of the primary design issues for a VCO is the purity of oscillation produced by the VCO.

B. Kim, D. Helman, and P. Gray describe a clock recovery circuit in "A 30-MHz Hybrid Analog/Digital Clock Recovery Circuit in 2-um CMOS," IEEE J. of Solid State Circuit, vol. SC-25, pp. 1385–1394, December, 1990 ("Kim et al."), hereby incorporated by reference. Kim et al. uses source-coupled nMOS transistors to implement a transconductor that converts input voltage into output current. In addition, Kim et al. has pMOS transistors operating as a resistive load. Adjusting the bias of the transconductor controls the transconductance, which in turn varies the oscillation frequency.

However, the voltage swing of a VCO has a strong influence on the generated frequency. More specifically, changes in the amplitude of the voltage of a VCO's outputs create undesirable jitter. Furthermore, some interface circuits that convert VCO signals into appropriate signal forms operate optimally only if the VCO fixes the amplitude of the voltage swings produced by the VCO. In an attempt to design a oscillator that will produce constant amplitude output voltage swings, one can use a replica bias circuit that mimics VCO characteristics that generates an appropriate bias to maintain relatively constant amplitude output voltage swings. However, this approach has some drawbacks with respect to the noise characteristics of the replica bias circuit. More specifically, the replica's amplitude control circuit generates substantial noise. This circuit noise eventually causes phase noise and jitter in the waveforms produced by the circuit.

Thus, there is a need for systems and methods for producing stable clock signals with reduced jitter.

BRIEF DESCRIPTION OF THE DRAWINGS

This embodiment of the invention can be readily understood by considering the following detailed description in conjunction with the accompanying drawings. The drawings are not necessarily drawn to scale.

The headings provided herein are for convenience only and do not necessarily affect the scope or meaning of the claimed invention.

DETAILED DESCRIPTION OF THE EMBODIMENTS

The invention will now be described with respect to various embodiments. The following description provides specific details for a thorough understanding of, and enabling description for, these embodiments of the invention. However, one skilled in the art will understand that the invention may be practiced without these details In other instances, well-known structures and functions have not been shown or described in detail to avoid unnecessarily obscuring the description of the embodiments of the invention. For each embodiment, the same reference numbers and acronyms identify elements or acts with the same or similar functionality for ease of understanding and convenience.

The problems and disadvantages described above are overcome by embodiments of the invention, which in at least one embodiment provides a voltage controlled oscillator (VCO) circuit capable of generating signals with reduced jitter and low phase noise. One embodiment of the VCO circuit provides two or more cascaded VCO cells. Each VCO cell can include a source coupled differential pair, a bias transistor connected to the differential pair for biasing the differential pair, a resistive load connected to the differential pair, and a voltage controlled capacitor, or a varactor, connected to the differential pair. The varactor provides for external control over the frequency of the oscillations produced by the VCO circuit.

In addition, the VCO circuit can include a global common mode feedback circuit coupled to each of the plurality of cascaded VCO cells for providing global common mode voltage control to each VCO cell. Common mode feedback operates to control the amplitude of the signals produced by the VCO circuit.

The invention is initially described in the context of an embodiment having a three delay stage or three cell VCO ring 100. However, other embodiments of the invention are susceptible to a variety of different configurations such as a VCO including two-stages or a VCO including more than three stages. Furthermore, one can apply embodiments of the invention in a variety of applications that use clock signal generators including a high-speed serial data link and RF transceivers. Wireless devices, for example, often incorporate RF transceivers and may include embodiments of the invention.

Figure 1:
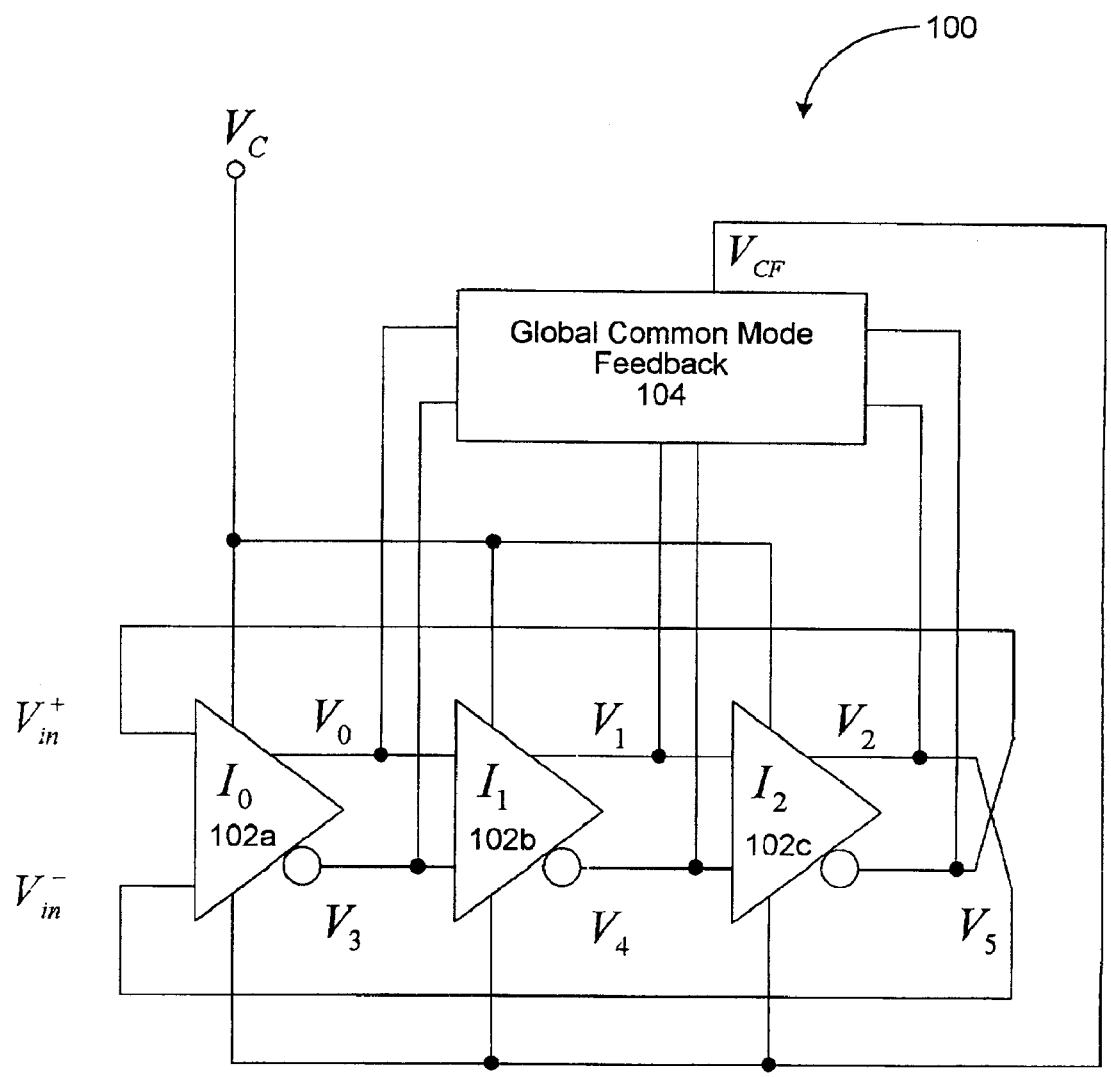
FIG. 1 is a schematic diagram of a VCO according to one embodiment of the invention.

Turning to FIG. 1, an embodiment of the invention provides a stable VCO 100 without using a replica bias circuit, thereby significantly reducing jitter in the VCO's outputs. FIG. 1 shows a VCO 100 made of three VCO cells or stages 102a, 102b, 102c connected in a ring-like manner. The outputs of the VCO cells are $V_0$ and $V_3$, $V_1$ and $V_4$, and $V_2$ and $V_5$, respectively. In stable oscillation, the gain of each cell is preferably one and each cell preferably provides an equal amount of phase delay. As described in greater detail herein, the outputs of the VCO $V_0$–$V_5$ are connected to an optional common mode feedback circuit 104 ("CMFB"). The feedback circuit 104 derives the difference between an average common mode voltage and a reference voltage to provide a common mode feedback to the VCO cells, 102a–102c, in the form of a voltage signal $V_{CF}$. The feedback circuit 104 helps to facilitate fine control of the amplitude of the VCO's 100 voltage swings on its outputs $V_0$–$V_5$. For example, when the average common mode voltage $V_{CM}$ is positive, $V_{CF}$ will also be correspondingly more positive. A more positive $V_{CF}$, by increasing the gate voltage on $M_B$, increases the conductance of $M_B$, which tends to decrease the common mode voltage of the VCO cells, thus counteracting and substantially eliminating the average common mode voltage $V_{CM}$. On the other hand, when the average common mode voltage $V_{CM}$ is negative, $V_{CF}$ will also be correspondingly more negative. A more negative $V_{CF}$ decreases the gate voltage on $M_B$, thereby decreasing the conductance of $M_B$, which tends to increase the common mode amplitude of the VCO cells, thus counteracting and substantially eliminating the average common mode voltage $V_{CM}$. While the amplitude of the VCO outputs $V_0$–$V_5$ is controlled by $V_{CF}$, the frequency of the VCO outputs $V_0$–$V_5$ is controlled by control voltage $V_C$. In some embodiments the control voltage is generated as shown with reference to FIG. 6.

Figure 2:
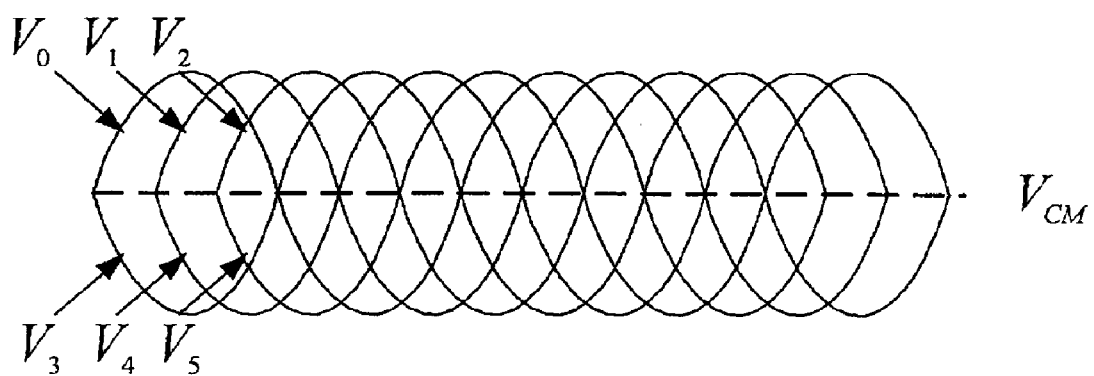
FIG. 2 is a graph illustrating voltage waveforms output by the VCO of FIG. 1.

Turning to FIG. 2, VCO-generated voltage waveforms on VCO outputs $V_0$–$V_5$ are shown. VCO cell $I_0$ 102a generates sinusoidal voltage outputs $V_0$ and $V_3$, which are substantially 180 degrees out of phase with each other. VCO cell $I_1$ 102b generates sinusoidal voltage outputs $V_1$ and $V_4$, which are substantially 180 degrees out of phase with each other. VCO cell $I_2$ 102a generates sinusoidal voltage outputs $V_2$ and $V_5$, which are substantially 180 degrees out of phase with each other. The sinusoidal voltages from each of the three VCO cells are substantially 60 degrees out of phase with the corresponding voltage outputs of each adjacent VCO cell. For example, $V_1$ is 60 degrees behind $V_0$ and 60 degrees ahead of $V_2$. Likewise, $V_4$ is 60 degrees behind $V_3$ and 60 degrees ahead of $V_5$. By way of example, as can be seen in FIG. 2, this embodiment produces clean voltage outputs with substantially reduced jitter, when compared with prior circuits.

Figure 3:
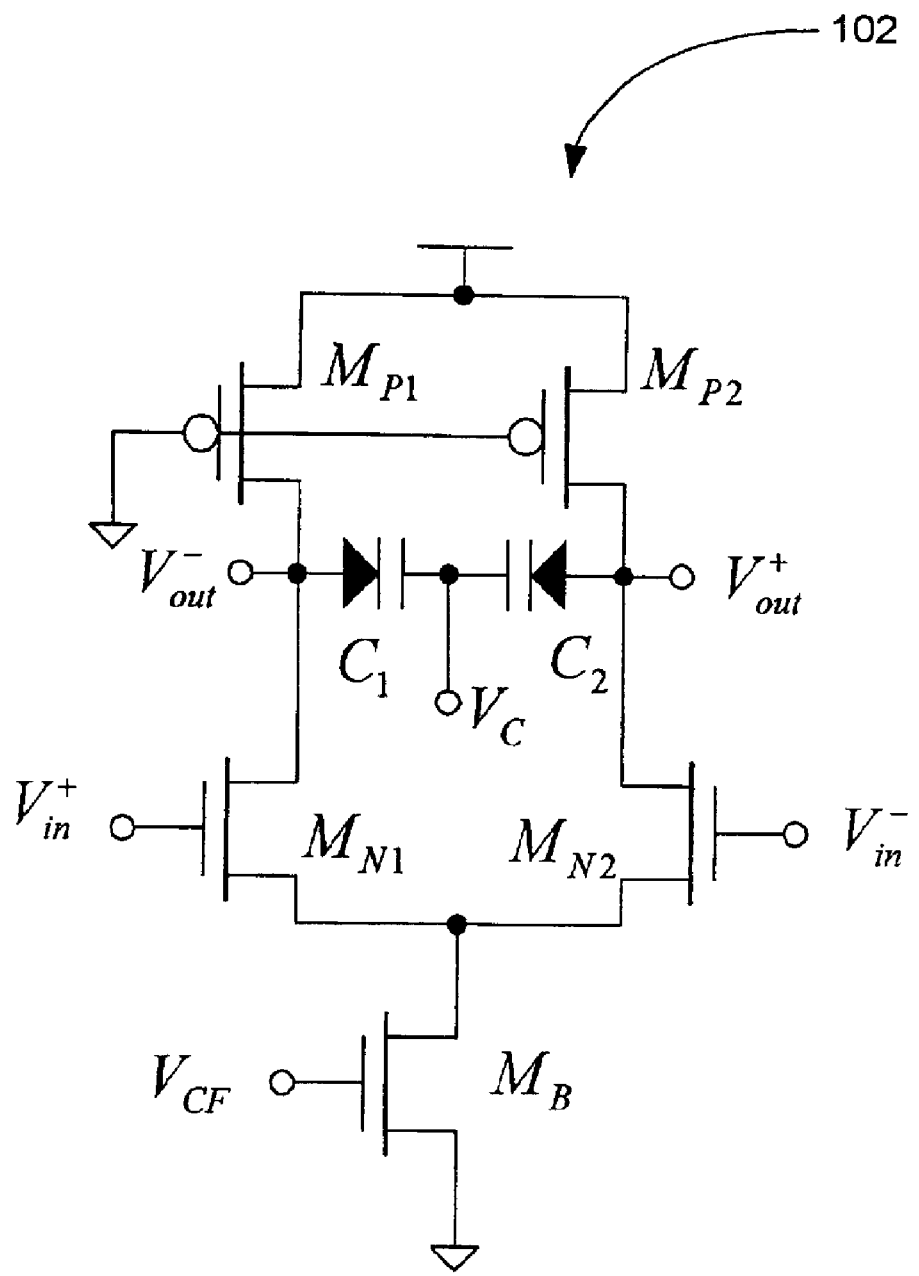
FIG. 3 is a circuit diagram of a VCO cell of the VCO of FIG. 1.

Turning to FIG. 3, a representative circuit diagram shows each VCO cell 102a–102c of the VCO 100. In each VCO cell 102a–102c an input voltage $V^+_{in}$ is applied to transistor $M_{N1}$, and a corresponding input voltage $V^-_{in}$ is applied to transistor $M_{N2}$. In the depicted embodiment, transistors $M_{N1}$, and $M_{N2}$ are n-type metal oxide semiconductor field effect transistors ("MOSFETs"), while transistors $M_{P1}$ and $M_{P2}$ are p-type MOSFETs. Transistors $M_{P1}$ and $M_{P2}$ have their gate voltages tied to ground, thus operating them in their saturated regions as resistive-type loads. The oscillating input voltages $V^+_{in}$ and $V^-_{in}$ control transistors $M_{N1}$ and $M_{N2}$, respectively, which in turn control electrical current flowing through variable capacitors $C_1$, and $C_2$ and resistive load transistors $M_{P1}$, $M_{P2}$. Because of symmetry, as shown in FIG. 2, each cell has a 60 degree delayed phase relationship between voltage input and voltage output. The phase delay is controlled by the voltage-controlled capacitors $C_1$ and $C_2$. Control voltage $V_C$ controls the variable capacitances of these voltage-controlled capacitors $C_1$ and $C_2$, shown in this embodiment as varactors. The varactors $C_1$ and $C_2$ are coupled to each VCO cell 102a–102c voltage outputs $V^-_{out}$ and $V^+_{out}$, respectively.

A monolithic integrated circuit fabrication process can implement the illustrated varactors using a p-n junction or metal oxide semiconductor ("MOS") interface. There are several implementations of MOS capacitors. For example, A. Porret et al. describe a design for a varactor for low-power wireless applications in "Design of High-Q Varactors for Low-Power Wireless Applications Using a Standard CMOS Process," IEEE J. of Solid State Circuit, vol. SC-35, No.3, pp. 337–345, March, 2000, hereby incorporated by reference. MOS capacitors reportedly show good low noise characteristics. In addition, changing the control voltage significantly varies the capacitance.

Figure 4:
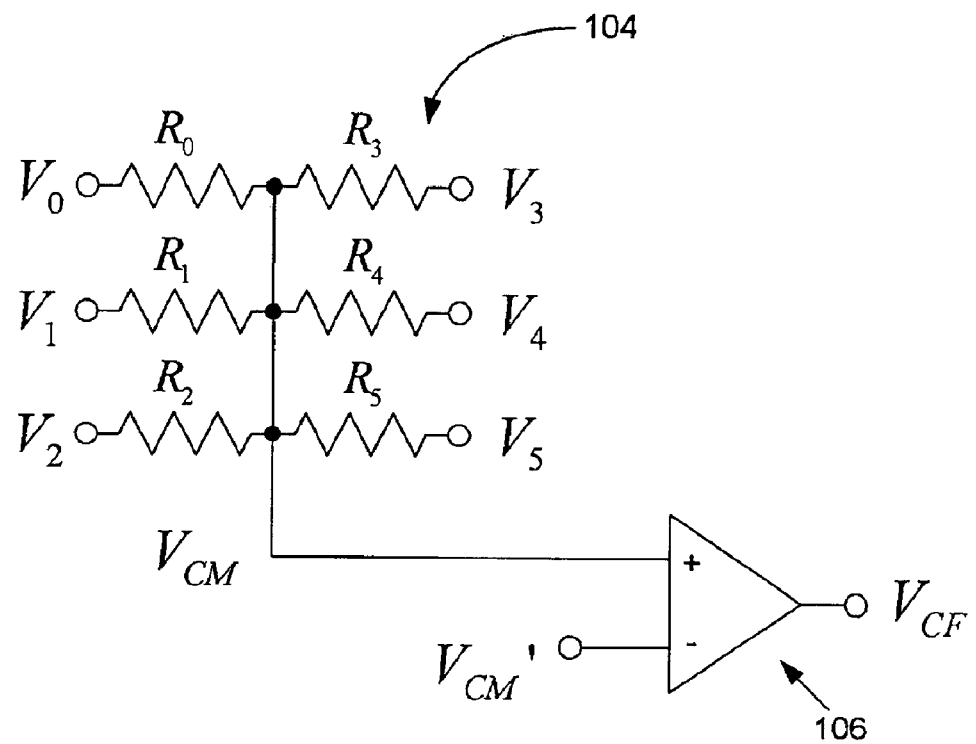
FIG. 4 is a circuit diagram of the global common mode feedback circuit of FIG. 1.

With reference to FIGS. 1, 3 and 4, the CMFB circuit 104 provides the voltage $V_{CF}$ at the gate of bias transistor $M_B$ and consequently controls the amplitude of the waveforms produced by the VCO 100. The CMFB circuit 104 senses the common mode voltage by using resistive connections between complementary voltage outputs $V^+_{out}$ and $V^-_{out}$, e.g., $V_0$ and $V_3$, $V_1$ and $V_4$, $V_2$ and $V_5$. More specifically, $V_0$ is connected to resistor $R_0$, $V_1$ is connected to resistor $R_1$, $V_2$ is connected to resistor $R_2$, $V_3$ is connected to resistor $R_3$, $V_4$ is connected to resistor $R_4$ and $V_5$ is connected to resistor $R_5$. Each of the resistors $R_0$–$R_5$ is also connected to each other as shown in FIG. 4 to produce a sensed output common mode voltage $V_{CM}$. The voltage $V_{CM}$ is compared to the desired voltage $V'_{CM}$ in an operational amplifier 106 ("op-amp") and the resulting error signal provides the common mode feedback voltage $V_{CF}$. In the depicted embodiment, the common mode feedback voltage $V_{CF}$ is connected to the gate of a bias transistor $M_B$ in FIG. 3 in each of the VCO cells 102a–102c in FIG. 1. With this feedback, the output common mode voltage remains relatively constant. The voltage output by the VCO 100 is independent of varactor capacitance and, thus, is independent of VCO frequency. As a result, the circuit does not need a control loop based on replica biasing. Eliminating replica biasing reduces the noise of the VCO. In addition, the bias current of this circuit is independent of the oscillation frequency. Consequently, one who implements a VCO according to the embodiment illustrated in FIG. 1 can, without difficulty, specify an effective voltage swing and bias.

Figure 5:
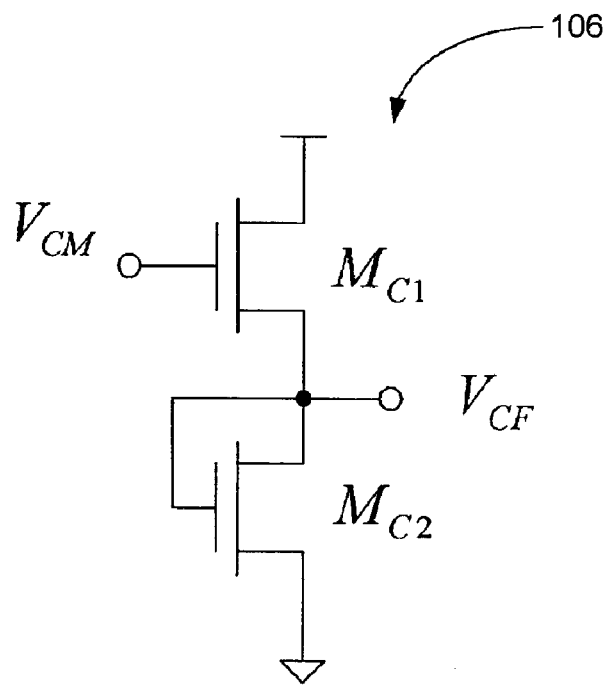
FIG. 5 is an implementation for a common mode feedback circuit amplifier of FIG. 4.

Turning to FIG. 5, the op-amp 106 of FIG. 4 is shown in more detail. The sensed common mode voltage $V_{CM}$ is connected to a circuit 106 similar to a source follower and comprised of transistors $M_{C1}$ and $M_{C2}$ connected in series between a power supply and ground. More specifically, $V_{CM}$ is connected to the gate of transistor $M_{C1}$, while the gate of transistor $M_{C2}$ is connected to its drain and the source of transistor $M_{C1}$ to form a connection for $V_{CF}$. Using this scheme, $V_{CM}$ is controlled by approximately the combined threshold voltages ("$V_{th}$") of the transistors $M_{C1}$ and $M_{C2}$, or 2 $V_{th}$. Assuming the transconductances of the transistors are large enough, $V_{th}$ is the threshold voltage of the transistors and then the output common mode voltage $V_{CM}$ is independent of frequency.

The VCO 100 senses global common mode voltage $V_{CM}$ by the resistive network $R_0$–$R_5$ shown in FIG. 4. In this embodiment, the common mode voltage has a reduced jitter compared to a circuit in which individual cells generate their own common mode voltages. Furthermore, the common mode control loop does not have to be fast compared to the VCO cell 102a–102c delay in order to maintain relatively constant VCO 100 output voltage swings. This design greatly simplifies the circuit implementation of a common mode voltage and it improves the VCO's 100 noise performance by averaging noise contributions from multiple cells; in one embodiment, a global common mode feedback circuit averages noise contributions from each cell.

This implementation of common mode feedback also operates to control the amplitude of the waveforms produced by the VCO 100. As the amplitude of a produced waveform increases, the transconductor transistors' $M_{N1}$, $M_{N2}$ drain voltages are lowered. As these voltages are lowered, the transistors $M_{N1}$. $M_{N2}$ enter a linear region that reduces the transconductance of the VCO cell. Reducing the transconductance of the VCO cells 102a–102c reduces the AC gain of the VCO 100 to 1 and stable oscillation results. The output common mode voltage is maintained by the control loop including the common mode feedback circuit. As the voltage grows, the effective AC gain of the VCO cells 102a–102c drop rapidly at the linear region edge. Gate and drain voltage differences between transistors $M_{N1}$ and $M_{N2}$ control this region. The output common mode voltage is also a function of a threshold voltage. As a result, the threshold voltages of the transistors control the output swing and the output swing is independent of the supply voltage. Global common mode feedback reduces the dependence of the VCO on changes in the supply, thus further enhancing noise performance.

Svelto et al. describe a LC-tank CMOS VCO in "A 1.3 GHz Low-Phase Noise Fully Tunable CMOS LC VCO", IEEE Journal on Solid State Circuits, Vol. 35, No. 3, March, 2000, hereby incorporated by reference in its entirety. However, the center frequency of an LC VCO is given by:

$$v_0 = \frac{1}{2\pi\sqrt{LC}}$$

Thus, the change in oscillation frequency versus the change in capacitance has the following relationship:

$$\frac{\partial v_o}{v_o} = -\frac{1}{2}\frac{\partial C}{C}$$

In a VCO without an inductor, the oscillation frequency is given by $$v_0 = \frac{kg_m}{C}$$

where $g_m$ is the effective transconductance of the VCO cell and C is the effective capacitance of the capacitor. Then, the change in oscillation frequency versus the change in capacitance is given by:

$$\frac{\partial v_o}{v_o} = -\frac{\partial C}{C}$$

As a result, the VCO without an inductor has twice the frequency control range as that of the VCO with an inductor.

Figure 6:
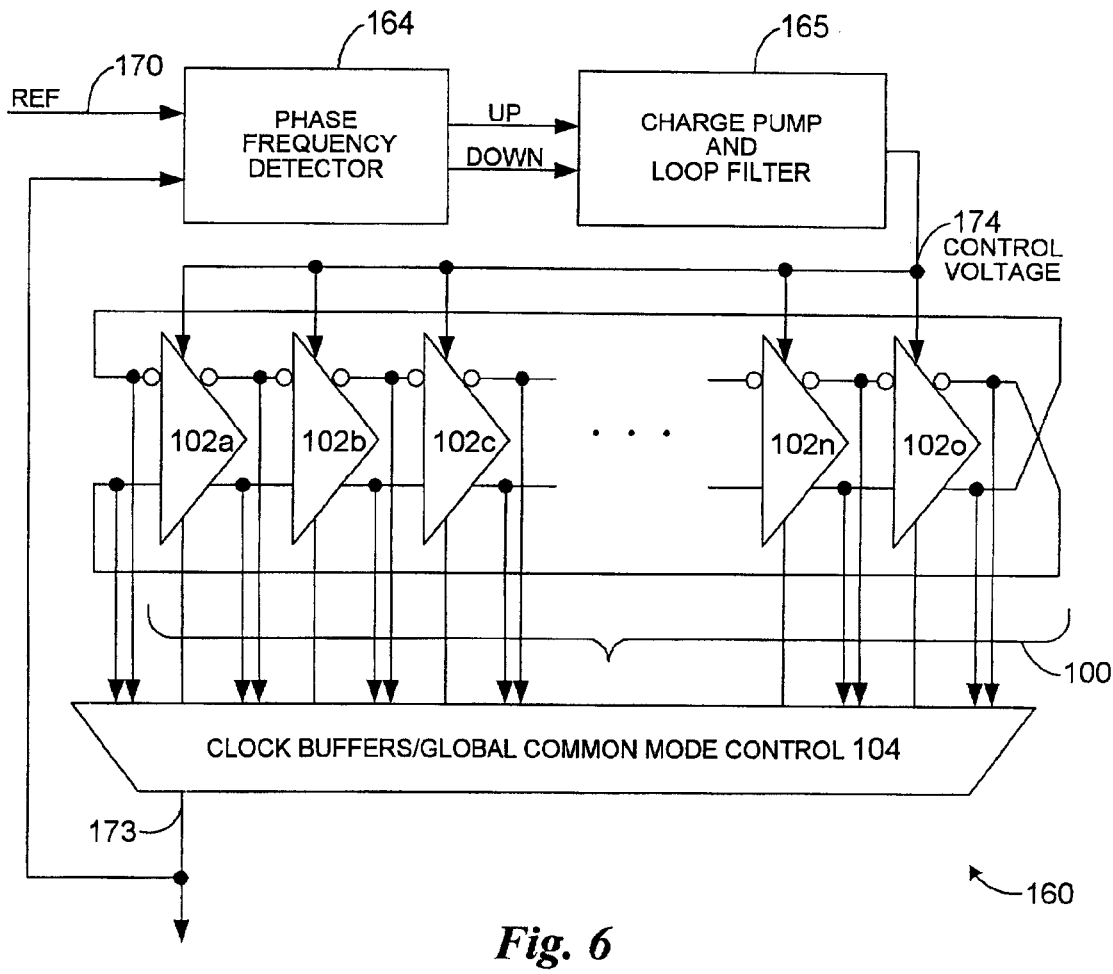
FIG. 6 is a schematic diagram illustrating a clock generator in one embodiment of the invention.

Turning to FIG. 6, there is illustrated a block diagram of clock circuit 160 under one embodiment of the invention to generate phase clocks supplied to a system such as a serial link system. A high-speed serial link is described in U.S. Pat. No. 5,675,584, entitled, "High Speed Serial Link for Fully Duplexed Data Communication," issued to Deog-Kyoon Jeong, hereby incorporated by reference. As shown in FIG. 6, the clock system 160 includes a phase frequency detector 164, a charge pump and loop filter 165, and a series of VCO cells 100. The illustrated circuit optionally also includes global common mode control 104 as shown in FIG. 1, etc. The global common mode control 104 operates to maintain the voltage swings of the VCO outputs relatively constant as described above.

The circuit depicted functions to receive a reference clock signal on line 170, and, in response to transitions in that clock signal, generates a desired number of internal clocks on N output lines 173 due to the effect of a frequency divider. Each of the clocks corresponds to a phase shifted clock signal. In the embodiment shown, the circuit 160 generates N equal phase shifted clock signals. In other words, between two sequential rising edges there are N rising edges of an internal clock. For example N=30. With a 50 MHz external reference clock, the system effectively can supply a much higher speed clock. The effective frequency is equal to the product of the number of stages and the VCO oscillation frequency, which in the illustrated example is 3 GHz. These multiple phase clocks can then be used to control a transmitter and data sampling functions of a serial link.

The embodiment depicted in FIG. 6 functions similarly to a phase-locked loop. The phase frequency detector 164 compares the frequency of one of the subphase clock signals from one delay cell 102a–102o with the frequency of the reference clock signal on line 170. The output of the phase frequency detector 164, after passing through the charge pump and loop filter 165, is fed back as $V_C$, in each delay cell 102 (see FIG. 3) to keep the delay precisely in phase with the reference clock signal. In this manner, the subfrequency clock signals on lines 173 are equal divisions of the original reference clock.

Phase frequency detector 164 provides an output signal related to the phase difference between a reference clock signal REF and the oscillator clock signal 173 from a stage of the VCO delay cells 100. The phase frequency detector 164 facilitates the maintenance of the oscillator clock in synchronism with the reference clock signal REF. The output of the phase frequency detector 164 controls the charge pump and loop filter 165, resulting in a control voltage being supplied on line 174 to the VCO delay cells 100. The control voltage speeds or slows the delay cells. Each of the delay cells 100 provides an output signal, which is delayed slightly from the output signal of a preceding delay cell 100. By virtue of the phase lock loop, each of the outputs of the delay cells 100 will be an integral division of the frequency of the reference clock signal. The frequency of the oscillator is controlled by the control voltage with the relationship:

$$f = \frac{1}{2 \cdot N \cdot Td}$$

where N is the number of VCO delay stages 100 and Td is the delay time of each VCO delay cell 100 as a function of the control voltage VC. Thus, the illustrated embodiment of a clock generator 160 incorporating a multi-stage VCO 100 and optionally global common mode control 104 facilitates the generation of stable multi-phase clocks with low phase noise and reduced jitter.

As noted above, FIG. 6 illustrates only one type of application for the VCO of the invention. The invention ran be implemented in other applications that use clock signal generators such as an RF transceiver in a wireless device.

Various other alternatives are possible. For example, as described above, the multi-phase clock signals are typically synchronized. In some alternative embodiments, the clock signals need not be synchronized, but additional circuitry, such as buffering circuits, are provided to so compensate. Rather than employing a $0^{th}$ phase internal clock signal, an external clock signal may be substituted in certain environments. While the six phases of multi-phase clock signals are described above as being 60° out of phase, different phase differences may be employed by changing the number of VCO cells 100.

Embodiments of the invention may be employed in not only systems, but also subsystems and chips. Complicated semiconductor chips having multiple subsystems operating under several different clocks may often be required to transmit data across such chip subsystems. Embodiments of the invention permit data to be accurately extracted from transmitted waveforms, thereby reducing bit error rates in such chips.

Incorporated by reference herein are all above references, patents, or applications and the following U.S. applications, which are assigned to the assignee of this application: Application No. 10/371220, entitled "DATA SYNCHRONIZATION ACROSS AN ASYNCHRONOUS BOUNDARY USING, FOR EXAMPLE, MULTI-PHASE CLOCKS". Application No. 09/989590, entitled "HIGH-SPEED BUS WITH EMBEDDED CLOCK SIGNALS" Application No. 09/989580, entitled "BIDIRECTIONAL BRIDGE CIRCUIT HAVING HIGH COMMON MODE REJECTION AND HIGH INPUT SENSITIVITY" (Attorney Docket No. 371798004US); Application No. 09/989645, entitled "SYSTEM AND METHOD FOR MULTIPLE-PHASE CLOCK GENERATION" and Application No. 10/043886, entitled "CLOCK AND DATA RECOVERY METHOD AND APPARATUS". Aspects of the invention can be modified, if necessary, to employ the systems, functions and concepts of the various patents and applications described above to provide yet further embodiments of the invention.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "above," "below," and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform routines having steps in a different order. The teachings of the invention provided herein can be applied to other systems, not necessarily the system described herein. These and other changes can be made to the invention in light of the detailed description. The elements and acts of the various embodiments described above can be combined to provide further embodiments.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a semiconductor chip, other aspects may likewise be embodied in a chip. Accordingly, the inventors reserve the right to add additional claims after filing the application to pursue such additional claim forms for other aspects of the invention.

We claim:

1. A voltage-controlled oscillator, comprising:

a plurality of cascaded voltage-controlled oscillator cells, each voltage-controlled oscillator cell having a plurality of outputs, each voltage-controlled oscillator cell further comprising:

a pair of source coupled nMOS transconductor transistors;

a bias transistor coupled between a ground voltage and the source coupled nMOS transconductor transistors;

a pair of varactors coupled to a control voltage and the pair of source coupled nMOS transconductor transistors;

a pair of drain coupled pMOS transistors, the pair of drain coupled pMOS transistors coupled between a supply voltage and the pair of source coupled nMOS transconductor transistors; and a common mode feedback circuit, the common mode feedback circuit further comprising:

a resistive network, the resistive network having a plurality of coupled resistors, each resistor coupled to one of the plurality of outputs of each voltage-controlled oscillator cell; and an op-amp, the op-amp connected to the resistive network, the op-amp generating an output voltage corresponding to a variance between the voltage-controlled oscillator cells and a reference voltage on a reference voltage output, the reference voltage output being coupled to each bias transistor in the plurality of cascaded voltage-controlled oscillator cells.

2. The voltage-controlled oscillator of claim 1, wherein the pair of varactors are MOS voltage-controlled capacitors.

3. The voltage-controlled oscillator of claim 1, wherein the pair of varactors are p-n junction voltage-controlled capacitors.

4. The voltage-controlled oscillator of claim 1, wherein the control voltage is provided at least in part by a charge pump circuit.

5. The voltage-controlled oscillator of claim 1, wherein the control voltage is provided at least in part by a loop filter circuit.

6. The voltage-controlled oscillator of claim 1, wherein the control voltage is provided at least in part by a phase frequency detector circuit.

7. The voltage-controlled oscillator of claim 1, wherein the control voltage is provided at least in part by a charge pump coupled with a loop filter circuit coupled with a phase frequency detector circuit.

8. The voltage-controlled oscillator of claim 1, wherein the plurality of cascaded voltage-controlled oscillator cells consists of three cascaded voltage-controlled oscillator cells.

9. A voltage-controlled oscillator, comprising:
   a plurality of cascaded voltage-controlled oscillator cells, each voltage-controlled oscillator cell having at least one output, each voltage-controlled oscillator cell further comprising:
      a first pair of coupled transistors;
      a bias transistor coupled to the first pair of coupled transistors;
      at least one voltage-controlled capacitor coupled to a control voltage and to the first pair of coupled transistors;
      a second pair of coupled transistors, the second pair of coupled transistors further coupled to the first pair of coupled transistors; and
      a common mode feedback circuit that simultaneously receives signals from each voltage controlled oscillator cell.

10. The voltage-controlled oscillator of claim 9, wherein, the common mode feedback circuit further comprising:
   a resistive network, the resistive network having a plurality of coupled resistors, each resistor coupled to the at least one output of each voltage-controlled oscillator cell; and
   an op-amp, the op-amp connected to the resistive network, the op-amp generating an output voltage corresponding to a variance between the voltage-controlled oscillator cells and a reference voltage on a reference voltage output, the reference voltage output being coupled to each bias transistor in the plurality of cascaded voltage-controlled oscillator cells.

11. The voltage-controlled oscillator of claim 9, wherein the pair of varactors are MOS voltage-controlled capacitors.

12. The voltage-controlled oscillator of claim 9, wherein the pair of varactors are p-n junction voltage-controlled capacitors.

13. The voltage-controlled oscillator of claim 9, wherein the control voltage is provided at least in part by a charge pump circuit.

14. The voltage-controlled oscillator of claim 9, wherein the control voltage is provided at least in part by a loop filter circuit.

15. The voltage-controlled oscillator of claim 9, wherein the control voltage is provided at least in part by a phase frequency detector circuit.

16. The voltage-controlled oscillator of claim 9, wherein the control voltage is provided at least in part by a charge pump coupled with a loop filter circuit coupled with a phase frequency detector circuit.

17. The voltage-controlled oscillator of claim 9, wherein the plurality of cascaded voltage-controlled oscillator cells consists of three cascaded voltage-controlled oscillator cells.

18. A method for reducing jitter in a voltage-controlled oscillator having a plurality of voltage-controlled oscillator cells, each voltage-controlled oscillator cell having a plurality of output voltage waveforms, the method comprising:
   combining each of the output voltage waveforms to produce a combined waveform;
   deriving a common mode feedback waveform from the combined waveform and from a reference waveform; and
   transmitting the common mode feedback waveform to each of the plurality of voltage-controlled oscillator cells.

19. A voltage-controlled oscillator having a plurality of voltage-controlled oscillator cells, each voltage-controlled oscillator cell having a plurality of output voltage waveforms, comprising:
   combining means for combining each of the output voltage waveforms to produce a combined voltage;
   deriving means for deriving a common mode feedback voltage from the combined voltage and a reference voltage; and
   transmitting means for transmitting the common mode feedback voltage to each of the plurality of voltage-controlled oscillator cells.

20. A wireless communications device, comprising:
   a voltage-controlled oscillator having a plurality, of cascaded voltage-controlled oscillator cells, each voltage-controlled oscillator cell having at least one output, each voltage-controlled oscillator cell further comprising:
      a first pair of coupled transistors;
      a bias transistor coupled to the first pair of coupled transistors;
      at least one voltage-controlled capacitor coupled to a control voltage and the first pair of coupled transistors;
      a second pair of coupled transistors, the second pair of coupled transistors further coupled to the first pair of coupled transistors; and
      a common mode feedback circuit that simultaneously receives signals from each voltage controlled oscillator cell.

21. The voltage-controlled oscillator of claim 20, wherein, the common mode feedback circuit further comprising:
   a resistive network, the resistive network having a plurality of coupled resistors, each resistor coupled to the at least one output of each voltage-controlled oscillator cell; and
   an op-amp, the op-amp connected to the resistive network, the op-amp generating an output voltage corresponding to a variance between the voltage-controlled oscillator cells and a reference voltage on a reference voltage output, the reference voltage output being coupled to each bias transistor in the plurality of cascaded voltage-controlled oscillator cells.

22. The voltage-controlled oscillator of claim 20, wherein the pair of varactors are MOS voltage-controlled capacitors.

23. The voltage-controlled oscillator of claim 20, wherein the pair of varactors are p-n junction voltage-controlled capacitors.

24. The voltage-controlled oscillator of claim 20, wherein the control voltage is provided at least in part by a charge pump circuit.

25. The voltage-controlled oscillator of claim 20, wherein the control voltage is provided at least in part by a loop filter circuit.

26. The voltage-controlled oscillator of claim 20, wherein the control voltage is provided at least in part by a phase frequency detector circuit.

27. The voltage-controlled oscillator of claim 20, wherein the control voltage is provided at least in part by a charge pump coupled with a loop filter circuit coupled with a phase frequency detector circuit.

28. The voltage-controlled oscillator of claim 20, wherein the plurality of cascaded voltage-controlled oscillator cells consists of three cascaded voltage-controlled oscillator cells.

29. A high-speed serial data link semiconductor chip, comprising:
    a voltage-controlled oscillator having a plurality of cascaded voltage-controlled oscillator cells, each voltage-controlled oscillator cell having at least one output, each voltage-controlled oscillator cell further comprising:
    a first pair of coupled transistors;
    a bias transistor coupled to the first pair of coupled transistors;
    at least one voltage-controlled capacitor coupled to a control voltage and the first pair of coupled transistors;
    a second pair of coupled transistors, the second pair of coupled transistors further coupled to the first pair of coupled transistors; and
    a common mode feedback circuit that simultaneously receives signals from each voltage controlled oscillator cell.

30. The semiconductor chip of claim 29, wherein, the common mode feedback circuit further comprising:
    a resistive network, the resistive network having a plurality of coupled resistors, each resistor coupled to the at least one output of each voltage-controlled oscillator cell; and
    an op-amp, the op-amp connected to the resistive network, the op-amp generating an output voltage corresponding to a variance between the voltage-controlled oscillator cells and a reference voltage on a reference voltage output, the reference voltage output being coupled to each bias transistor in the plurality of cascaded voltage-controlled oscillator cells.

31. The semiconductor chip of claim 29, wherein the pair of varactors are MOS voltage-controlled capacitors.

32. The semiconductor chip of claim 29, wherein the pair of varactors are p-n junction voltage-controlled capacitors.

33. The semiconductor chip of claim 29, wherein the control voltage is provided at least in part by a charge pump circuit.

34. The semiconductor chip of claim 29, wherein the control voltage is provided at least in part by a loop filter circuit.

35. The semiconductor chip of claim 29, wherein the control voltage is provided at least in part by a phase frequency detector circuit.

36. The semiconductor chip of claim 29, wherein the control voltage is provided at least in part by a charge pump coupled with a loop filter circuit coupled with a phase frequency detector circuit.

37. The semiconductor chip of claim 29, wherein the plurality of cascaded voltage-controlled oscillator cells consists of three cascaded voltage-controlled oscillator cells.

* * * * *

UNITED STATES PATENT AND TRADEMARK OFFICE
CERTIFICATE OF CORRECTION

PATENT NO.   : 6,717,478 B1                                        Page 1 of 1
DATED        : April 6, 2004
INVENTOR(S)  : Ook Kim et al.

It is certified that error appears in the above-identified patent and that said Letters Patent is hereby corrected as shown below:

Column 2,
Line 51, insert period between "details" and "In";

Signed and Sealed this

Seventh Day of September, 2004

JON W. DUDAS
*Director of the United States Patent and Trademark Office*